(12) United States Patent
Lee

(10) Patent No.: US 10,868,203 B1
(45) Date of Patent: Dec. 15, 2020

(54) FILM-BASED IMAGE SENSOR WITH PLANARIZED CONTACTS

(71) Applicant: Apple Inc., Cupertino, CA (US)

(72) Inventor: Hong-Wei Lee, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/288,128

(22) Filed: Feb. 28, 2019

Related U.S. Application Data

(60) Provisional application No. 62/662,229, filed on Apr. 25, 2018.

(51) Int. Cl.

| | |
|---|---|
| H01L 29/06 | (2006.01) |
| H01L 31/0352 | (2006.01) |
| H01L 27/146 | (2006.01) |
| H01L 31/0224 | (2006.01) |
| H01L 31/02 | (2006.01) |
| H01L 31/18 | (2006.01) |
| H01L 31/0216 | (2014.01) |

(52) U.S. Cl.
CPC ........ *H01L 31/035218* (2013.01); *H01L 27/14636* (2013.01); *H01L 27/14645* (2013.01); *H01L 27/14685* (2013.01); *H01L 31/02005* (2013.01); *H01L 31/02161* (2013.01); *H01L 31/022408* (2013.01); *H01L 31/022475* (2013.01); *H01L 31/1884* (2013.01); *H01L 27/1462* (2013.01); *H01L 27/14621* (2013.01); *H01L 27/14627* (2013.01)

(58) Field of Classification Search
CPC ....... H01L 31/035218; H01L 31/02005; H01L 31/02161; H01L 31/022408; H01L 31/022475; H01L 31/1884; H01L 27/14–14893; H01L 27/14636; H01L 27/14645; H01L 27/14685; H01L 27/1462; H01L 27/14621; H01L 27/14627
USPC .......................................................... 257/9
See application file for complete search history.

(56) References Cited

U.S. PATENT DOCUMENTS

| | | |
|---|---|---|
| 5,543,354 A | 8/1996 | Richard et al. |
| 8,501,510 B2 | 8/2013 | Chao et al. |
| 8,558,286 B2 | 10/2013 | Tian et al. |
| 8,947,566 B2 | 2/2015 | Kobayashi et al. |

(Continued)

OTHER PUBLICATIONS

Chang et al., U.S. Appl. No. 16/231,515, filed Dec. 23, 2018.

*Primary Examiner* — Calvin Y Choi
(74) *Attorney, Agent, or Firm* — Kligler & Associates Patent Attorneys Ltd

(57) ABSTRACT

An imaging apparatus includes a semiconductor substrate, an array of pixel circuits formed on the semiconductor substrate and including respective pixel electrodes. A layer of a photosensitive medium overlies the pixel electrodes and has a lower surface in electrical contact with the pixel electrodes, and is configured to convert incident photons into charge carriers, which are collected by the pixel electrodes. A planar conductive top electrode, which is at least partially transparent, overlies an upper surface of the photosensitive medium. A bias circuit is formed on the semiconductor substrate and configured to provide a bias potential for application to the photosensitive medium. A bias contact extends from the bias circuit to the top electrode so as to apply the bias potential to the top electrode while contacting the top electrode along a plane that is parallel to the upper surface of the photosensitive medium.

4 Claims, 3 Drawing Sheets

(56) References Cited

U.S. PATENT DOCUMENTS

| | | |
|---|---|---|
| 2009/0103037 A1 | 4/2009 | Abe et al. |
| 2009/0268072 A1* | 10/2009 | Makiyama ............. H04N 5/378 |
| | | 348/311 |
| 2011/0212567 A1 | 9/2011 | Tsai et al. |
| 2013/0020468 A1 | 1/2013 | Mitsuhashi et al. |
| 2016/0043144 A1* | 2/2016 | Sato .................. H01L 27/14601 |
| | | 438/59 |

* cited by examiner

FILM-BASED IMAGE SENSOR WITH PLANARIZED CONTACTS

CROSS-REFERENCE TO RELATED APPLICATION

This application claims the benefit of U.S. Provisional Patent Application 62/662,229, filed Apr. 25, 2018, which is incorporated herein by reference.

FIELD OF THE INVENTION

The present invention relates generally to optoelectronic devices, and particularly to image sensors.

BACKGROUND

Hybrid image sensors have a photosensitive layer overlaid on and connected to pixel circuitry on a silicon chip. For example, the photosensitive layer may comprise a photosensitive film, such as a film containing quantum dots (known as a quantum film).

A typical structure of a hybrid image sensor comprises a photosensitive layer, top and bottom conductive layers serving respectively as top and bottom electrodes to the photosensitive layer, and pixel circuitry. The photosensitive layer can be designed, for example, as a blanket photo-resistive layer with linear signal output as a function of an applied voltage, or with non-linear response to the applied voltage, similar to a photodiode response. The top electrode (or electrodes) on the photosensitive layer is typically common for a group of pixels or all pixels of the array and at least partially transparent to the incoming light, and is coupled to an electrode contact that provides the required bias voltage.

U.S. Pat. No. 8,558,286, whose disclosure is incorporated herein by reference, describes a photodetector along with corresponding materials, systems, and methods. The photodetector comprises an integrated circuit and at least two optically sensitive layers. A first optically sensitive layer is over at least a portion of the integrated circuit, and a second optically sensitive layer is over the first optically sensitive layer. Each optically sensitive layer is interposed between two electrodes. The two electrodes include a respective first electrode and a respective second electrode. The integrated circuit selectively applies a bias to the electrodes and reads signals from the optically sensitive layers. The signal is related to the number of photons received by the respective optically sensitive layer.

SUMMARY

Embodiments of the present invention that are described hereinbelow provide improved image sensors and methods for their manufacture.

There is therefore provided, in accordance with an embodiment of the present invention, an imaging apparatus, including a semiconductor substrate, an array of pixel circuits formed on the semiconductor substrate and including respective pixel electrodes, and a layer of a photosensitive medium, which overlies the pixel electrodes and has a lower surface in electrical contact with the pixel electrodes, and which is configured to convert incident photons into charge carriers, which are collected by the pixel electrodes. The imaging apparatus further includes a planar conductive top electrode, which is at least partially transparent, overlying an upper surface of the photosensitive medium, a bias circuit formed on the semiconductor substrate and configured to provide a bias potential for application to the photosensitive medium, and a bias contact extending from the bias circuit to the top electrode so as to apply the bias potential to the top electrode while contacting the top electrode along a plane that is parallel to the upper surface of the photosensitive medium.

In an embodiment, the layer of the photosensitive medium includes a quantum film.

In a further embodiment, the imaging apparatus includes an insulating layer overlying the bias circuit and at least partially surrounding the photosensitive medium, wherein the bias contact extends through the insulating layer. In another embodiment, the insulating layer includes silicon dioxide.

There is further provided, in accordance with another embodiment of the invention, an imaging apparatus, including a semiconductor substrate, an array of pixel circuits formed on the semiconductor substrate and including respective pixel electrodes, and a layer of a photosensitive medium, which overlies the pixel electrodes and has a lower surface in electrical contact with the pixel electrodes, and which is configured to convert incident photons into charge carriers, which are collected by the pixel electrodes. The imaging apparatus further includes a bias circuit formed on the semiconductor substrate and configured to provide a bias potential for application to the photosensitive medium, an insulating layer overlying the bias circuit and at least partially surrounding the photosensitive medium, a planar conductive top electrode, which is at least partially transparent, overlying an upper surface of the photosensitive medium and the insulating layer, and a bias contact extending from the bias circuit through the insulating layer so as to contact and apply the bias potential to the top electrode.

In an embodiment, the insulating layer includes silicon dioxide.

In yet another embodiment, the layer of photosensitive medium includes a quantum film. In a further embodiment, the quantum film has a thickness of at least 1 μm.

There is also provided, in accordance with an embodiment of the invention, a method for fabricating an imaging apparatus, including forming an array of pixel circuits and a bias circuit on a semiconductor substrate, depositing a first insulating layer over the semiconductor substrate, and forming in the first insulating layer an array of pixel electrodes in electrical contact with respective pixel circuits, and a first bias contact in electrical contact with the bias circuit. The method further includes depositing a second insulating layer over the first insulating layer, extending the bias contact through the second insulating layer, opening a cavity in the second insulating layer by removing a part of the second insulating layer that covers the array of pixel contacts, depositing a layer of a photosensitive medium in the cavity with a lower surface of the photosensitive medium in electrical contact with the pixel electrodes, and depositing a conductive and at least partially transparent layer over the photosensitive medium and the second insulating layer so that a plane of the conductive layer that is parallel to the upper surface of the photosensitive medium is in electrical contact with the bias contact.

The present invention will be more fully understood from the following detailed description of the embodiments thereof, taken together with the drawings in which:

DETAILED DESCRIPTION OF EMBODIMENTS

Figure 1:
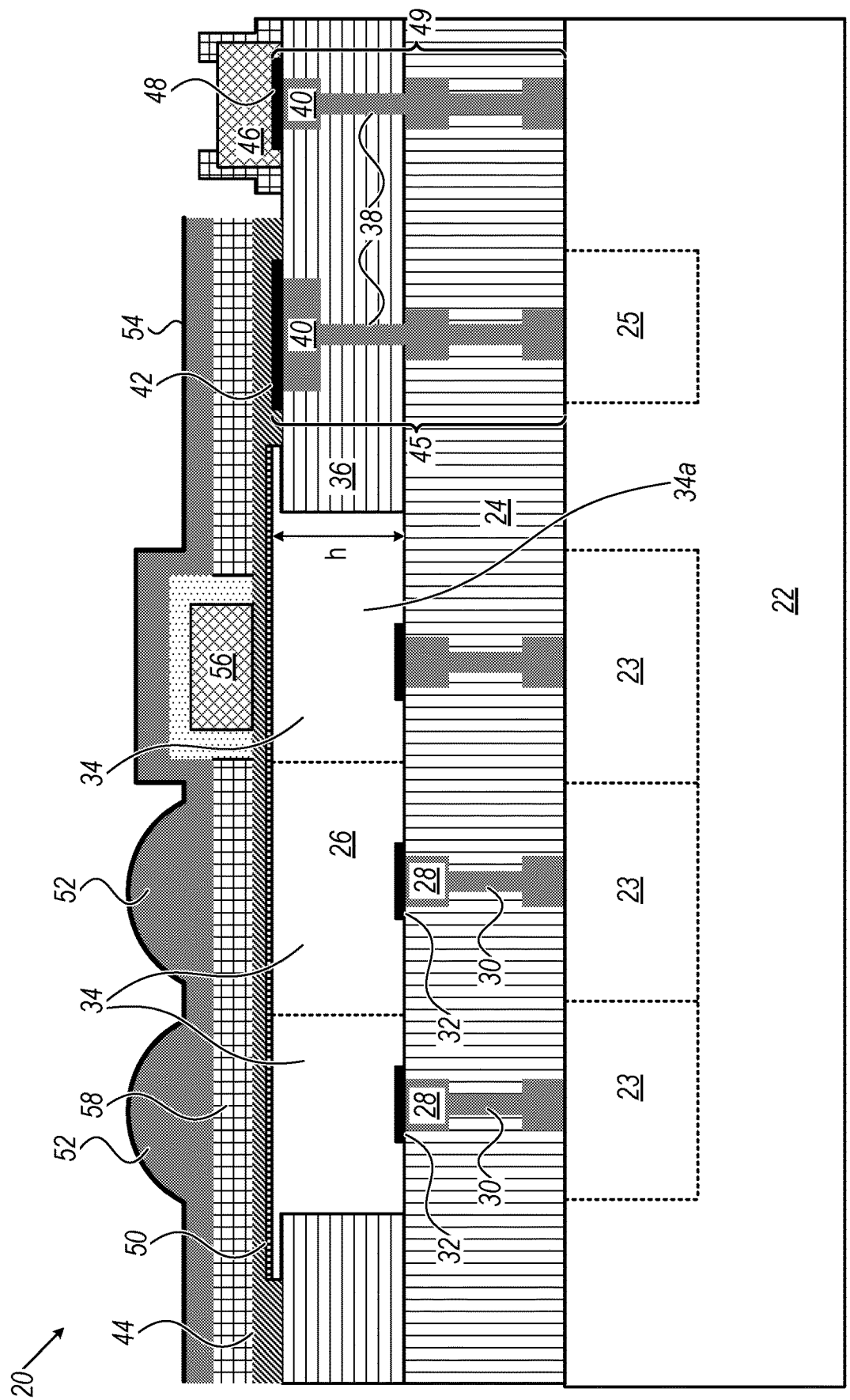
FIG. 1 is a schematic sectional view of an image sensor, in accordance with an embodiment of the invention.

Hybrid image sensors typically comprise a layer of a photosensitive medium, such as a quantum film (QF), which is sandwiched between an at least partially transparent, conductive top electrode (comprising, for example, ITO (indium-tin oxide)) and bottom electrodes, also referred to as pixel electrodes. Each of the bottom electrodes defines a pixel of the image sensor and is connected to a corresponding pixel circuit. The top electrode is coupled to a bias contact, also referred to as a bias node, which provides the top electrode with a bias potential for the photosensitive layer.

In hybrid image sensors that are known in the art, the bias contact and bottom electrodes are formed by the same process steps. Consequently, the top of the bias contact is level with the top of the bottom electrodes, at the bottom of the photosensitive layer. In this contact configuration, the edge of the photosensitive layer is cut, using etching or similar methods known in the art, in order to provide space for a conducting path from the top electrode to the bias contact. This conducting path typically comprises a thin layer of metal, such as aluminum, extending from the top of the device to the bias contact. This sort of metal layer contacts the top electrode only through a sidewall, which contacts the edge of the top electrode and extends along the edge of the photosensitive layer down to the bias contact. This kind of edge contact is highly resistive, which may limit the charge/discharge response time of the photosensitive layer due to a high RC-factor.

Another problem that can arise when the edge of a photosensitive film, such as a quantum film, is handled in this manner is that the film has a tendency to peel off the underlying layers, particularly when the thickness of the film is greater than 0.5 µm. This tendency limits the permissible thickness of the film and can therefore constrain the quantum efficiency, which increases with the film thickness.

The embodiments of the present invention that are described herein address the problems described above and may thus enable the fabrication of image sensors with a faster response time and possibly higher quantum efficiency.

The disclosed embodiments extend the bias contacts up to the level of the top electrode. This enables a direct connection between the bias contact and the bottom surface of the top electrode along a plane that is parallel to the upper surface of the photosensitive medium, and thus the generation of a large contact area between the bias contact and the top electrode. This sort of connection can reduce the contact resistance (in some instances by multiple orders of magnitude) as compared to that of a conventional edge contact. Consequently, the RC-factor of the conducting path from the top electrode to the bias contact is lower, with a concomitant decrease in the charge/discharge response time of the image sensor.

In the disclosed embodiments the extension of the bias contact is achieved by depositing and patterning an additional insulating layer (such as $SiO_2$) and extending the bias contact through this layer. The photosensitive layer is formed in a cavity in the additional insulating layer, so that it is coplanar with the insulating layer and of comparable thickness, and the insulating layer at least partially surrounds the photosensitive medium. For an embodiment wherein the photosensitive layer comprises a photosensitive film, such as a quantum film, the insulating layer protects the edges of the film, thus reducing the risk of peeling. By an appropriate adjustment of the fabrication process, a quantum film with a thickness exceeding 1 µm is achievable, improving its quantum efficiency relative to sensors that use thinner film layers.

FIG. 1 is a schematic sectional view of an image sensor 20, in accordance with an embodiment of the invention. Image sensor 20 is fabricated on a silicon substrate 22, on which pixel circuits 23, a bias circuit 25, and additional electrical conductors (not shown) are fabricated using methods of integrated circuit technology that are known in the art. A first insulating layer 24, typically comprising silicon dioxide ($SiO_2$), is coated on silicon substrate 22. A layer of a photosensitive medium of image sensor 20 is formed over first insulating layer 24. In the pictured embodiment, the photosensitive medium comprises a quantum film (QF) 26. In alternative embodiments the photosensitive medium may comprise, for example, elemental semiconductors, compound semiconductors, colloidal nanocrystals, epitaxial quantum wells, epitaxial quantum dots, organic photoconductors, bulk heterojunction organic photoconductors, or any other suitable photosensitive material that is known in the art. These materials may be hybrid-bonded to image sensor 20, and may form, for example, photoconductors, p-n junctions, heterojunctions, Schottky-diodes, quantum well stacks, quantum wires, quantum dots, phototransistors, or combinations of these devices connected in series and parallel.

Pixel circuits 23 are coupled to QF 26 by first metal contacts 28, typically comprising aluminum or copper, which extend through first vias 30 (passing through first insulating layer 24) to respective bottom electrodes 32 (also referred to as pixel electrodes). Each bottom electrode 32 electrically contacts the lower surface of QF 26 and defines a pixel 34 in the QF. QF 26 converts incident photons into charge carriers, which are collected by bottom electrodes 32. Typically (although not necessarily), pixels 34 form a two-dimensional matrix, arranged in rows and columns. Each row and column typically comprises hundreds or thousands of pixels 34. However, for the sake of clarity, only three pixels 34 are shown in FIG. 1, with one of them being a "dark pixel" 34a used for calibration purposes. QF 26 is formed within an opening in a second insulating layer 36, of a thickness h, where the second insulating layer is formed over first insulating layer 24 and typically comprises $SiO_2$, as well. Since QF 26 is surrounded by second insulating layer 36, the QF may also be deposited to a thickness h with a reduced risk of peeling off the underlying layers, and is effectively limited only by the etch aspect ratio of second vias 38, etched through second insulating layer 36. By depositing second insulating layer 36 to a thickness exceeding 1 µm, also the thickness of QF 26 may exceed 1 µm, thus enabling a high quantum efficiency for the film.

Second metal contacts 40 extending through second vias 38 in second insulating layer 36 and connecting through corresponding vias in first insulating layer 24 connect bias circuit 25 to a bias pad 42 at the level of the top of QF 26. Bias pad 42 contacts a top electrode 44, overlying QF 26, along a plane that is parallel to the upper surface of the QF so as to apply a bias potential provided by bias circuit 25 to the top electrode. The specific first metal contact 28 that is in electrical contact with bias circuit 25, its extension by second metal contact 40, and bias pad 42 together form a bias contact 45, which couples top electrode 44 to bias circuit 25.

Bond pads 46 and bond pad contacts 48 may be formed on top of second insulating layer 36 and connected to the circuits on silicon substrate 22 through similar metal contacts and vias, forming a bond contact 49. (Several bond pads 46 are formed for the image sensor to provide inputs and outputs for electrical potentials and signals to and from the sensor, but for the sake of clarity only one is shown in FIG. 1). Bond pads 46 are further coupled to any required external circuitry.

A top encapsulation layer 50 seals QF 26. Top electrode 44, comprising conductive and at least partially transparent material such as ITO, covers QF 26 (which is under top encapsulation layer 50) and second insulating layer 36. Top electrode 44 is in electrical contact with bias pad 42 of bias contact 45 through the bottom surface of the electrode rather than through its edge. This contact configuration ensures a much larger contact area than an edge contact and yields a contact resistance between bias contact 45 and top electrode 44 that is substantially lower than for an edge contact. This reduced resistance ensures a low RC factor and a fast response of sensor 20.

Each pixel 34 (except for dark pixel 34a) is covered by a micro-lens 52 for enhanced light collection. Micro-lenses 52 are coated by an anti-reflection coating 54 in order to reduce the light loss due to reflections from the interfaces between the micro-lenses and air. Pixels 32 may be optionally covered with an array of color filters, located between the pixel array and the micro-lens array. The addition of a color filter array depends on the wavelengths of interest and the application of the imaging apparatus. Micro-lenses 52 are isolated from top electrode 44 by a passivation layer 58.

Metallic optical shield 56 covers one of pixels 34 for the purpose of generating "dark pixel" 34a.

Figure 2:
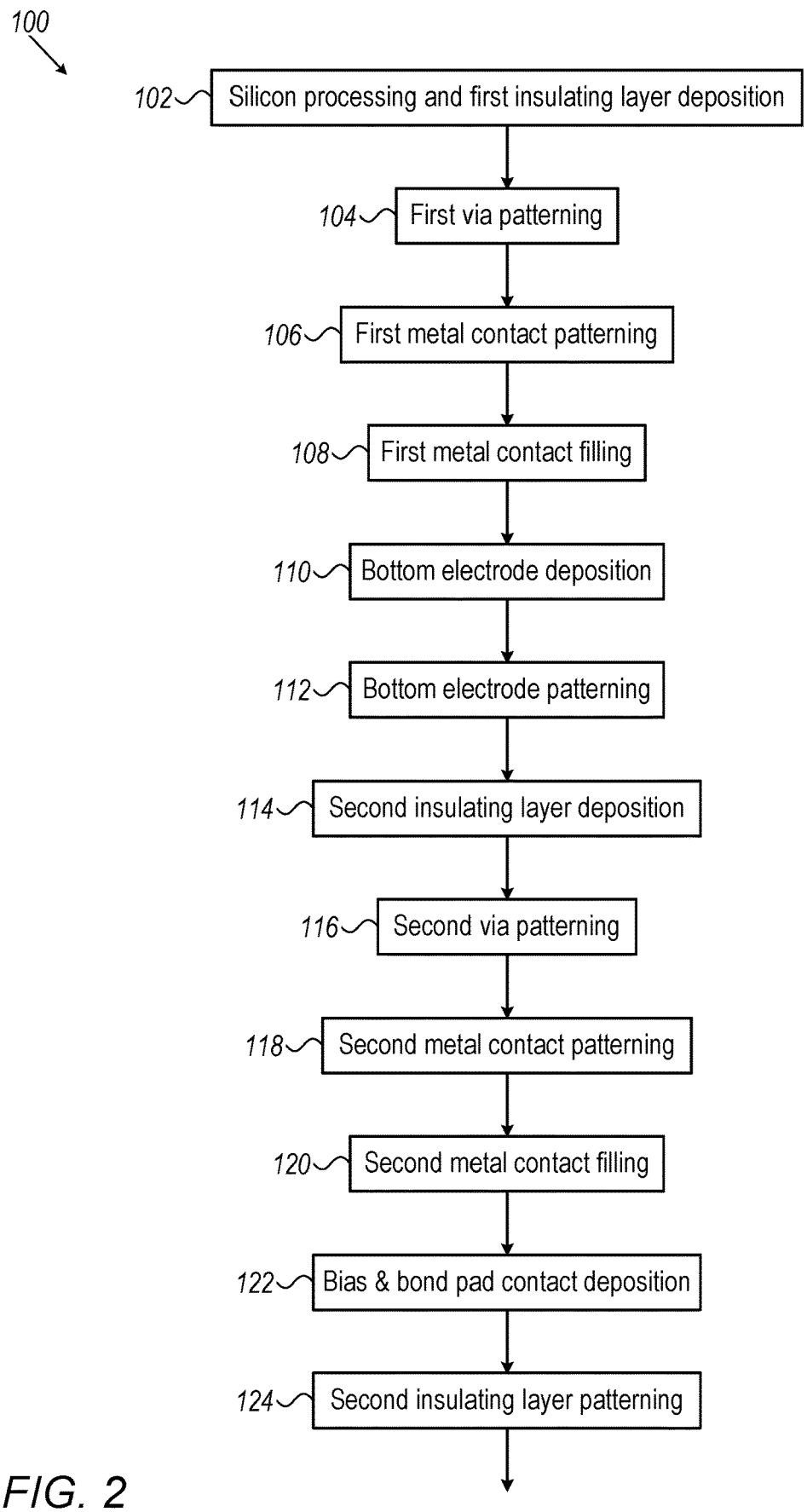
FIG. 2 is a flowchart that schematically illustrates the fabrication process flow of the image sensor shown in FIG. 1, in accordance with an embodiment of the invention.
Figure 2:
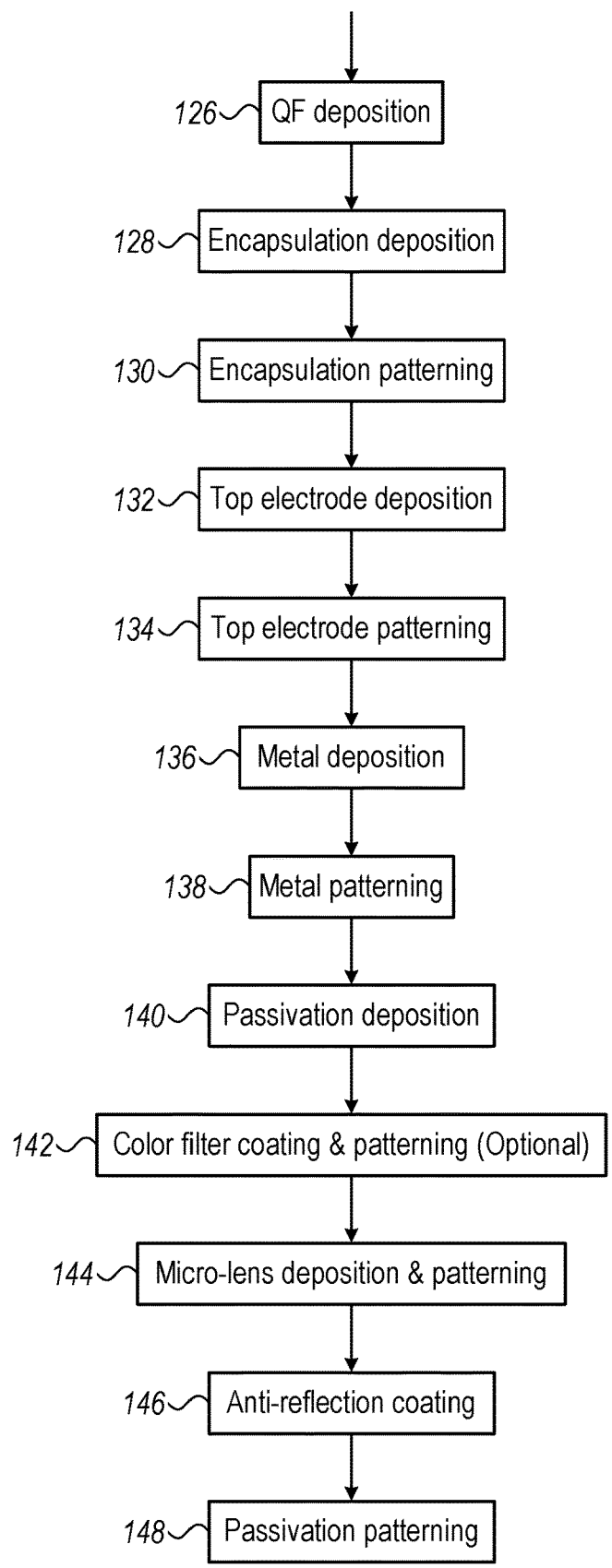

FIG. 2 is a flowchart 100 that schematically illustrates the fabrication process flow of image sensor 20 shown in FIG. 1, in accordance with an embodiment of the invention. All of the process steps described in the flowchart use techniques of semiconductor fabrication that are known in the art. References to specific items utilize the labels from FIG. 1. The first step in the flowchart, a silicon processing and first insulating layer deposition step 102, comprises the steps of fabricating pixel circuits 23, bias circuit 25, and the additional electrical conductors in the silicon substrate, as well as depositing first insulating layer 24.

In a first via patterning step 104, first vias 30 are etched through first insulating layer 24. In a first metal contact patterning step 106, the top ends of the metal filling first vias 30 are patterned. In a first metal contact filling step 108, first vias 30 are filled with a metal, typically comprising aluminum or copper. In a bottom electrode deposition step 110 and a bottom electrode patterning step 112, bottom electrodes 32 are respectively deposited and patterned on top of first metal contacts 28, over which QF 26 will be deposited in a later QF deposition step. In second insulating layer deposition step 114, second insulating layer 36 is deposited on top of first insulating layer 24. In a second via patterning step 116, vias are etched through second insulating layer 36 for bias contact 45 and for bond contact 49, connecting to corresponding first vias 30. In a second metal contact patterning step 118 and a second metal contact filling step 120, second vias 38 are filled with a metal and patterned similarly to the filling of first vias 30 and patterning of first metal contacts 28. In a contact deposition step 122, contacts are deposited and patterned on top of second metal contacts 40, thus defining bias pad 42 and bonding pad contact 48.

In a second insulating layer patterning step 124, a cavity is etched through second insulating layer 36 down to the level of bottom electrodes 32 (pixel electrodes). QF 26 is deposited in this cavity in a QF deposition step 126. In an encapsulation deposition step 128, top encapsulation layer 50 is deposited over QF 26, and in an encapsulation patterning step 130, it is etched outside the pixel array to uncover bias pad 42. In a top electrode deposition step 132, top electrode 44 is deposited over the area of QF 26 and second insulating layer 36. Top electrode 44 makes electrical contact along its lower surface with bias contact 45 through its bias pad 42. In a top electrode patterning step 134, top electrode layer 44 is removed from bond pad 46 contact area.

In a metal deposition step 136 and a metal patterning step 138, metal pads are respectively deposited and patterned to form metallic optical shield 56 and bond pad 46. In a passivation deposition step 140, passivation layer 58 is deposited over the entire surface of the image sensor. A color filter array may optionally be coated and patterned over the pixel array in a color filter coating and patterning step 142. In a micro-lens deposition and patterning step 144, micro-lens material is deposited and patterned to form one micro-lens 52 over each individual pixel 34. In an anti-reflection coating step 146, one or more thin layers of $SiO_2$ or $SiO_xN_y$ (silicon oxynitride) are deposited over the surface of micro-lenses 52 to serve as anti-reflection coating 54 for the lenses. In a passivation patterning step 148, passivation layer 58 is opened at bond pad 46 in order to provide access for coupling any external circuitry to the bond pad.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. Imaging apparatus, comprising:
   a semiconductor substrate;
   an array of pixel circuits formed on the semiconductor substrate and comprising respective pixel electrodes;
   a layer of a photosensitive medium, which overlies the pixel electrodes and has a lower surface in electrical contact with the pixel electrodes, and which is configured to convert incident photons into charge carriers, which are collected by the pixel electrodes;
   a planar conductive top electrode, which is at least partially transparent, overlying an upper surface of the photosensitive medium;
   a bias circuit formed on the semiconductor substrate and configured to provide a bias potential for application to the photosensitive medium; and
   a bias contact extending from the bias circuit to the top electrode so as to apply the bias potential to the top electrode while contacting the top electrode along a plane that is coplanar with the upper surface of the photosensitive medium.

2. The imaging apparatus according to claim 1, wherein the layer of the photosensitive medium comprises a quantum film.

3. The imaging apparatus according to claim 1, and comprising an insulating layer overlying the bias circuit and at least partially surrounding the photosensitive medium, wherein the bias contact extends through the insulating layer.

4. The imaging apparatus according to claim 3, wherein the insulating layer comprises silicon dioxide.

* * * * *